United States Patent
Fukase et al.

(10) Patent No.: US 7,999,193 B2
(45) Date of Patent: Aug. 16, 2011

(54) WIRING SUBSTRATE AND METHOD OF MANUFACTURING THE SAME

(75) Inventors: Katsuya Fukase, Nagano (JP); Kishio Yokouchi, Kawasaki (JP); Hideaki Yoshimura, Kawasaki (JP)

(73) Assignees: Shinko Electric Industries, Co., Ltd., Nagano-shi (JP); Fujitsu Limited, Kawasaki-shi (JP)

( * ) Notice: Subject to any disclaimer, the term of this patent is extended or adjusted under 35 U.S.C. 154(b) by 535 days.

(21) Appl. No.: 12/247,471

(22) Filed: Oct. 8, 2008

(65) Prior Publication Data

US 2009/0095520 A1    Apr. 16, 2009

(30) Foreign Application Priority Data

Oct. 12, 2007   (JP) ................. 2007-267116

(51) Int. Cl.
   *H05K 1/11*   (2006.01)
(52) U.S. Cl. ......... 174/263; 174/262; 174/264; 174/266
(58) Field of Classification Search .......... 174/262–266; 361/792–795
   See application file for complete search history.

(56) References Cited

U.S. PATENT DOCUMENTS

| | | | | |
|---|---|---|---|---|
| 5,401,911 A | * | 3/1995 | Anderson et al. | 174/262 |
| 5,861,666 A | * | 1/1999 | Bellaar | 257/686 |
| 6,087,597 A | * | 7/2000 | Shimada et al. | 174/263 |
| 6,139,777 A | * | 10/2000 | Omoya et al. | 252/500 |
| 2004/0151882 A1 | * | 8/2004 | Tani et al. | 428/209 |
| 2005/0011677 A1 | * | 1/2005 | Yoshino et al. | 174/263 |
| 2005/0099565 A1 | * | 5/2005 | Shin et al. | 349/139 |
| 2005/0218503 A1 | * | 10/2005 | Abe et al. | 257/700 |

FOREIGN PATENT DOCUMENTS

| JP | 5-329354 | 12/1993 |
|---|---|---|
| JP | 2007-012746 | 1/2007 |
| WO | 2004/064467 | 7/2004 |

\* cited by examiner

*Primary Examiner* — William Mayo, III
*Assistant Examiner* — Sherman Ng
(74) *Attorney, Agent, or Firm* — Rankin, Hill & Clark LLP

(57) ABSTRACT

There is provided a wiring substrate. The wiring substrate includes: a core substrate formed of a conductive material and having a through hole therein; an insulating layer formed on first and second surfaces of the core substrate; wiring patterns formed on the first and second surfaces via the insulating layer; and a via formed in the through hole and electrically connected to the wiring patterns. The via includes: a conductor ball and a conductor portion. The conductor ball has a conductive surface and an insulating member covering the conductive surface. A portion of the conductive surface is exposed from the insulating member. The conductor portion is electrically connected to the exposed conductive surface and the wiring patterns. At least one of the insulating member and the insulating layer is interposed between the via and the core substrate.

14 Claims, 8 Drawing Sheets

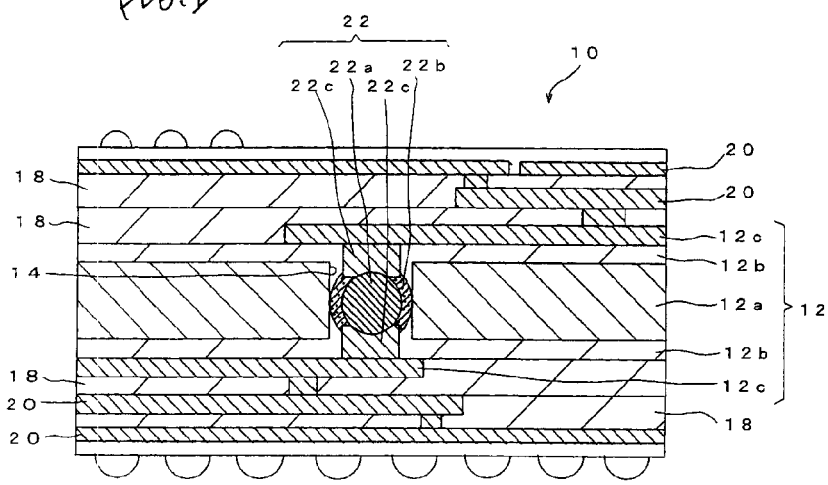
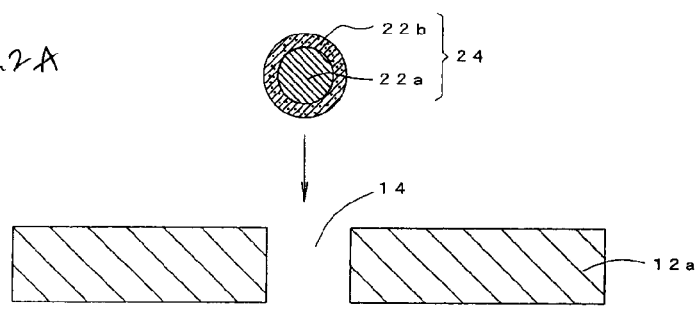
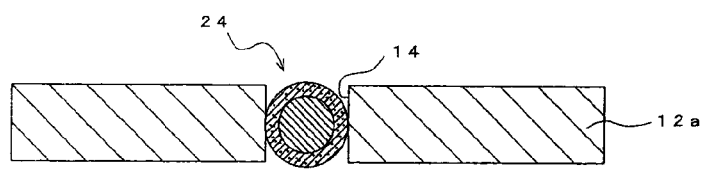
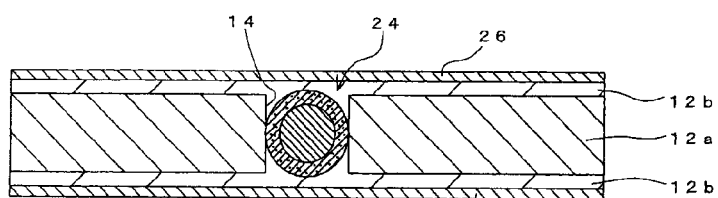
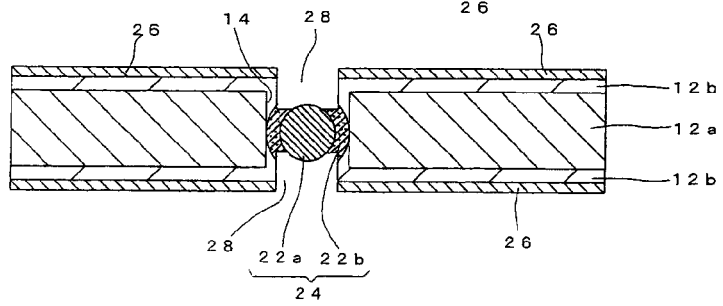

WIRING SUBSTRATE AND METHOD OF MANUFACTURING THE SAME

This application is based on and claims priority from Japanese Patent Application No. 2007-267116, filed on Oct. 12, 2007, the entire contents of which are hereby incorporated by reference.

BACKGROUND

1. Technical Field

The present disclosure relates to a wiring substrate and a method of manufacturing the wiring substrate, and more particularly, to a wiring substrate including a core layer where wiring patterns are formed on both surfaces of a core substrate made of a conductive material via insulating layers and are connected to each other by a via formed in a through hole passing through the core substrate, and a method of manufacturing the wiring substrate.

2. Related Art

In recent years, a core substrate, which is mainly made of carbon fiber and an insulating resin and has a thermal expansion coefficient lower than other members of a wiring substrate, (hereinafter, simply referred to as a core substrate having a low thermal expansion coefficient) has been used in order to reduce a thermal expansion coefficient of the wiring substrate (see e.g., International Patent Publication No. WO2004/064467).

However, in the above core substrate, conductive carbon fiber is used in the core substrate having the low thermal expansion coefficient. For this reason, as shown in FIG. 7, in a core layer 102 constituting a wiring substrate 100, a via 106 is formed in a through hole 104 passing through a core substrate 102a with an insulating layer 102b interposed between the inner surface of the through hole and the via. The via electrically connects wiring patterns 102c and 102c that are formed on both surfaces of the core substrate 102a, which has a low thermal expansion coefficient, via the insulating layer 102b made of an insulating resin. The via 106 is a cylindrical via 106a formed in the through hole 104 via the insulating layer 102b, and a hollow portion of the cylindrical via 106a is filled with a resin 106b.

In the wiring substrate 100 shown in FIG. 7, wiring patterns 110 are formed on both surfaces of the core layer 102 with insulating layers 108 interposed therebetween.

In order to manufacture the wiring substrate 100 shown in FIG. 7, firstly, as shown, in FIG. 8A, the through hole 104 is formed in the core substrate 102a, which is made of a carbon fiber and an insulating resin and has a low thermal expansion coefficient, by a drill. Then, as shown in FIG. 8B, the insulating layer 102b is formed on both surfaces of the core substrate 102a with an insulating resin, and the through hole 104 is filled with the insulating resin.

Further, as shown in FIG. 8C, a through hole 105 having a diameter smaller than that of the through hole 104 is formed in the through hole 104 of the core substrate 102a by a drill. Then, a metal layer 114 is formed on the surfaces of the insulating layers 102b and on the inner surface of the through hole 105 by plating or vapor deposition (see FIG. 8D).

As shown in FIG. 8E, the through hole 105 is filled with the insulating resin 106b. Then, protrusions of the insulating resin 106b, which protrude from the through hole 105, are removed by performing polishing so that the insulating resin is flush with the surface of the metal layer 114 (see FIG. 8F).

As shown in FIG. 9A, a metal layer 116 is formed on the surface of the metal layer 114 and the polished surfaces of the insulating resin 106b by plating deposition. Then, the wiring patterns 102c are formed by patterning the metal layers 114 and 116 so that the core layer 102 is formed (see FIG. 9B).

In the core layer 102, the via 106 is formed in the through hole 104, which passes through the conductive core substrate 102a, with the insulating layer 102b interposed therebetween. The via 106 is the cylindrical via 106a formed in the through hole 104 with the insulating layer 102b interposed therebetween, and a hollow portion of the cylindrical via 106a is filled with the insulating resin 106b that forms the insulating layer 102b.

Then, the wiring patterns 110, 110 . . . are layered on the both surfaces of the core layer 102 by a known additive method or semi-additive method via the insulating layers 108. Accordingly, it is possible to form the wiring substrate 100 shown in FIG. 7.

Further, a via formed by inserting a coaxial wire, where the surface of a resin film covering a metal wire is covered with plated metal, into a through hole of a substrate is described in JP-A-2007-12746. According to this method, it is possible to simply form a via.

However, in the case where the coaxial wire is inserted into the through hole, alignment of the coaxial wire is necessary and the metal wire of the coaxial wire needs to be exposed in a longitudinal direction of the through hole in this method. For this reason, the steps thereof become complicated. Furthermore, the coaxial wire needs to have a certain level of strength so that the coaxial wire can be inserted into the through hole. For this purpose, if the coaxial wire is made thin in order to form a via with a small pitch, the buckling or separation of the coaxial wire is likely to occur.

A core substrate, which is made of a carbon fiber and an insulating resin and has a thermal expansion coefficient lower than other members of the wiring substrate, is used as the core substrate 102a in the wiring substrate 100 shown in FIG. 7. For this reason, the thermal expansion coefficient of the wiring substrate can be lowered as compared with the related-art wiring substrate that is formed using a core substrate made of a resin. Accordingly, even when a semiconductor device is mounted on the wiring substrate 100 shown in FIG. 7, it is possible to decrease the generation of a crack caused by the difference between the thermal expansion coefficients of the semiconductor device and the wiring substrate.

However, in the wiring substrate 100 shown in FIG. 7, the via 106 passing through the core substrate 102a is formed in the through hole 104 formed in the core substrate 102a with an insulating layer 102b, which is formed along the inner surface of the through hole, interposed therebetween.

For this reason, in the steps of manufacturing the wiring substrate 100 shown in FIG. 7, after the through hole 104 is formed to pass through the core substrate 102a, the through hole 104 is filled with an insulating resin and then the through hole 105 needs to be formed again. The through hole 105 should be accurately formed at the center of the through hole 104. This is because there is a possibility that the thickness of the insulating layer 106a has deviation and the reliability of the via 106 deteriorates if the through hole 105 is deviated from the center of the through hole 104.

Further, in order to ensure the reliability of the via 106 by reducing the deviation of the thickness of the insulating layer 106a as much as possible, a certain level of the diameter of the through hole 104, which is to be formed in the core substrate 102a, should be ensured in view of the accuracy of processing for forming the through hole 105 in the through hole 104. Thus, it is difficult to form the via 106 with a small pitch.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a wiring substrate in which the structure of a via passing through a core substrate made of a conductive material can be simplified and the via can be formed with a small pitch, and a method of manufacturing the wiring substrate.

According to one or more aspects of the present invention, there is provided a wiring substrate. The wiring substrate includes: a core substrate formed of a conductive material and having a through hole therein; an insulating layer formed on first and second surfaces of the core substrate; wiring patterns formed on the first and second surfaces via the insulating layer; and a via formed in the through hole and electrically connected to the wiring patterns. The via comprises: a conductor ball having: a conductive surface and; an insulating member covering the conductive surface, wherein a portion of the conductive surface is exposed from the insulating member, and a conductor portion electrically connected to the exposed conductive surface and the wiring patterns. At least one of the insulating member and the insulating layer is interposed between the via and the core substrate.

According to one or more aspects of the present invention, the conductive surface is a metal surface containing a spherical metal particle and the insulating member is an insulating resin film.

According to one or more aspects of the present invention, the metal particle is a copper particle.

According to one or more aspects of the present invention, the core substrate has the lowest thermal expansion coefficient in the wiring substrate.

According to one or more aspects of the present invention, the core substrate is formed of a carbon fiber and an insulating resin.

According to one or more aspects of the present invention, the through hole is a tapered through hole in which one opening on the first surface of the core substrate has a diameter larger than the other opening on the second surface of the core substrate.

According to one or more aspects of the present invention, there is provided a method of manufacturing a wiring substrate. The method includes: (a) forming a through hole in a core substrate formed of a conductive material; (b) inserting a conductor ball in the through hole, the conductor ball having a conductive surface and an insulating member covering the entire conductive surface; (c) forming an insulating layer on both surfaces of the core substrate and in the thorough hole; (d) forming recesses in the through hole, from the both surfaces of the core substrate, such that a portion of the conductive surface of the conductor ball is exposed from the insulating layer and the insulating member and such that the recesses have a diameter smaller than that of the through hole; (e) forming a metal layer in the recesses and on the both surfaces of the core substrate via the insulating layer; and (f) patterning the metal layer formed on the both surfaces of the core substrate to form wiring patterns.

According to one or more aspects of the present invention, step (a) includes: forming the through hole into a tapered shape such that one opening on one surface of the core substrate has a diameter larger than the other opening on the other surface of the core substrate.

Furthermore, step (c) may include laminating a metal foil on the insulating layer. Alternatively, in step (c), the insulating layer attached to a metal foil may be used.

According to the present invention, the conductor ball of which the conductive surface is covered with the insulating member is inserted into the through hole passing through the conductive core substrate made of a conductive material, thereby forming the via. Accordingly, the insulating member of the conductor ball can be used as a part of the insulating layer formed on the inner surface of the through hole of the core substrate.

Therefore, it is possible to form the via without forming a through hole again in the through hole formed in the core substrate, and to form the via with a small pitch.

In addition, since the insulating member of the conductor ball functions as a part of the insulating layer formed on the inner surface of the through hole of the core substrate, it is possible to reduce the deviation of the thickness of the insulating layer and also to maintain the reliability of the via formed with a small pitch.

Further, according to the present invention, a step of forming a through hole in a resin filled in a through hole formed to pass through a core substrate, a step of forming a metal layer on the inner surface of the formed through hole, and a step of polishing can be omitted in the related art steps of forming a via in a conductive core substrate. Thus, it is possible to simplify steps of manufacturing the via.

In addition, the conductor ball of which the entire conductive surface is covered with the insulating member is used in the present invention. Accordingly, when the conductor ball is inserted into the through hole of the core substrate, it is possible to omit a step of determining an insertion direction of the conductor ball, and thus the via can be easily formed in the through hole of the core substrate.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof, presented in conjunction with the following drawings wherein:

FIG. 1 is a cross-sectional view illustrating a wiring substrate according to an embodiment of the present invention;

FIGS. 2A to 2D are views illustrating a part of steps of manufacturing the wiring substrate shown in FIG. 1;

DETAILED DESCRIPTION

Figure 3A:
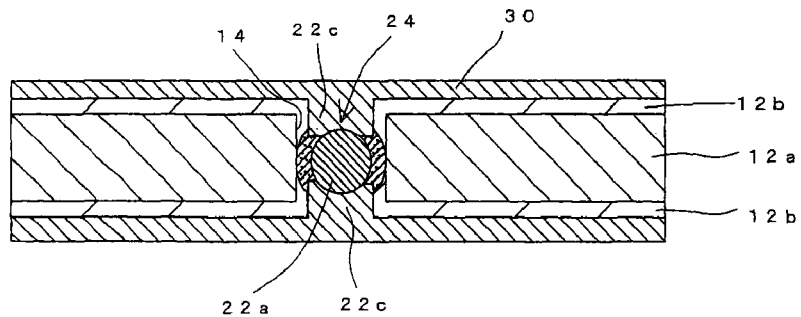
FIGS. 3A and 3B are views illustrating other parts of the steps of manufacturing the wiring substrate shown in FIG. 1.

Exemplary embodiments of the present invention will be described with reference to the drawings hereinafter.

A wiring substrate according to an embodiment of the present invention is shown in FIG. 1. A core layer 12 including a core substrate 12a having a thermal expansion coefficient lower than other members of a wiring substrate is formed in the wiring substrate 10 shown in FIG. 1. The core substrate 12a of the core layer 12 is made of a carbon fiber and an insulating resin and is a conductive substrate.

Wiring patterns 12c and 12c are formed on both surfaces of the core substrate 12a via insulating layers 12b made of an insulating resin, and are connected to each other by a via 22 formed in a through hole 14 that passes through the core substrate 12a. The via 22 is formed to extend in a longitudinal direction of the through hole without coming in contact with the inner peripheral surface of the through hole 14.

The via 22 includes a conductor ball 22a (spherical copper particle) and conductor portions (columnar parts 22c and 22c made of copper metal). The conductor ball 22a is inserted into the through hole 14. Also, the conductor ball 22a has a conductive surface (copper surface) and an insulating member 22b made of an insulating resin. The insulating member 22b covers the conductive surface except for a part of the conductor ball 22a facing the longitudinal direction of the through hole 14. One ends of the conductor portions are connected to the exposed conductive surface (copper surface) of the conductor ball 22a. The other ends of the conductor portions (columnar parts 22c and 22c) pass through the insulating layers 12b, which are made of an insulating resin and formed on the both surfaces of the core substrate 12a, and are electrically connected to the wiring patterns 12c and 12c.

The exposure surfaces, where the conductive surface (copper surface) of the conductor ball 22a connected to the one ends of the columnar parts 22c and 22c is exposed, face the longitudinal direction of the through hole 14 that is formed so as to pass through the core substrate 12a. Meanwhile, the insulating member 22b, which covers the conductive surface (copper surface) of the conductor ball 22a except for the exposure surfaces, is not removed and remains. Accordingly, the portion of the insulating member 22b, which covers the conductive surface of the conductor ball 22a, forms an insulating layer between the conductor ball 22a and the inner surface of the through hole 14 that is formed so as to pass through the core substrate 12a.

Gaps between the columnar parts 22c and 22c (or the insulating member 22b covering the peripheral surface of the conductor ball 22a) and the inner surface of the through hole 14 are filled with an insulating resin of the insulating layers 12b.

Figure 7:
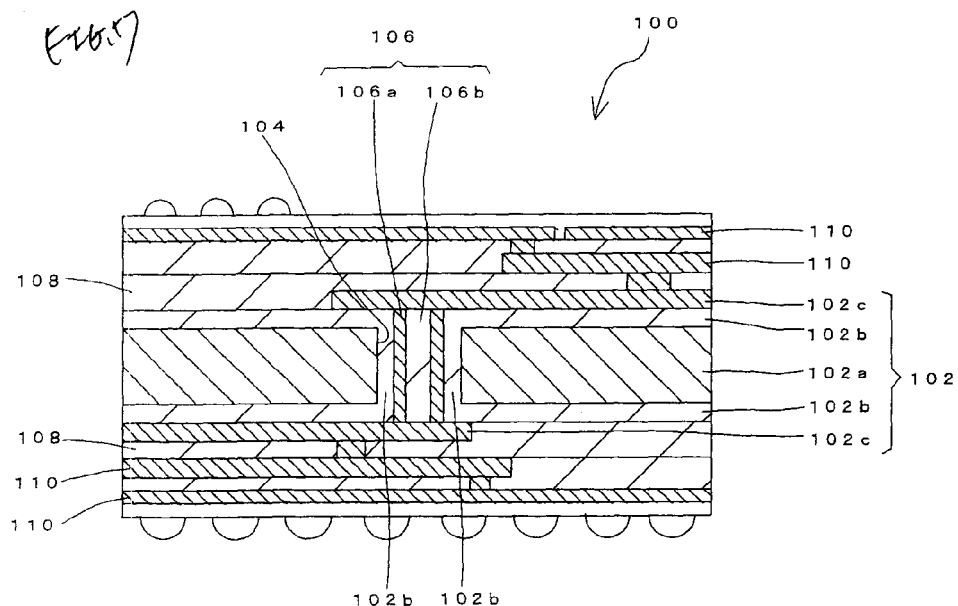
FIG. 7 is a cross-sectional view of a wiring substrate in the related art.
Figure 8A:
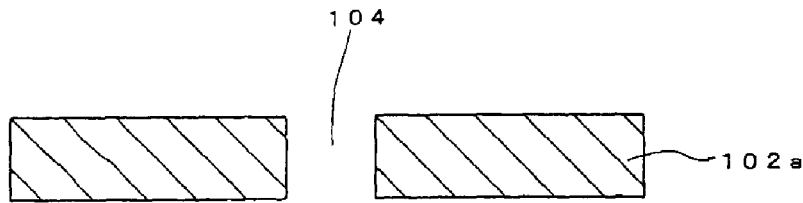
FIGS. 8A to 8F are views illustrating a part of steps of manufacturing the related-art wiring substrate shown in FIG. 7.
Figure 8B:
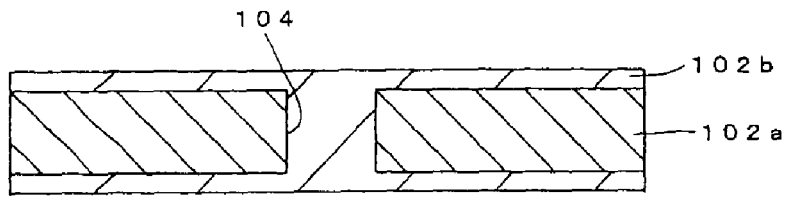
Figure 8C:
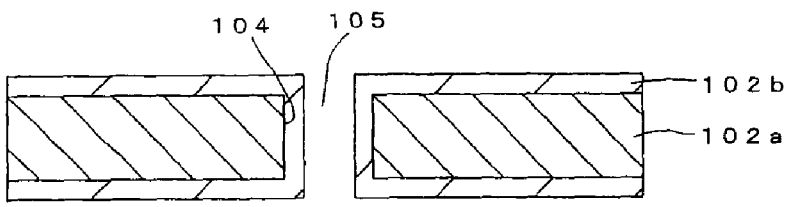
Figure 8D:
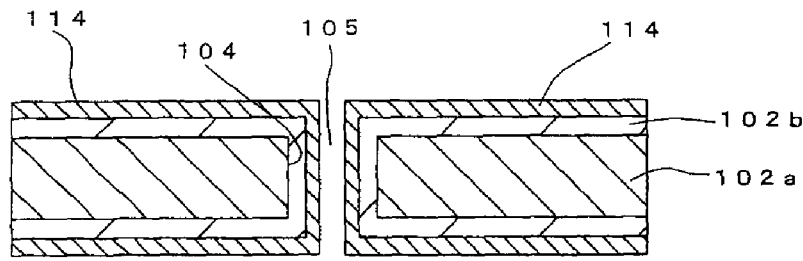
Figure 8E:
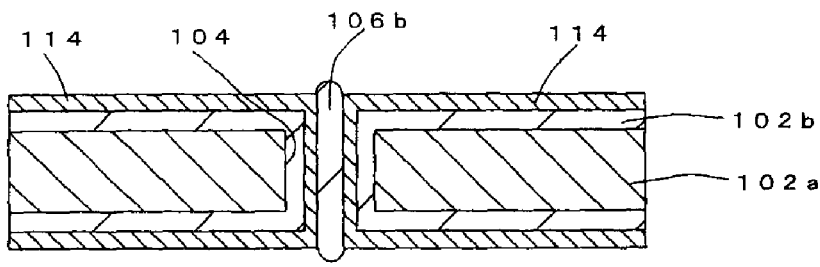
Figure 8F:
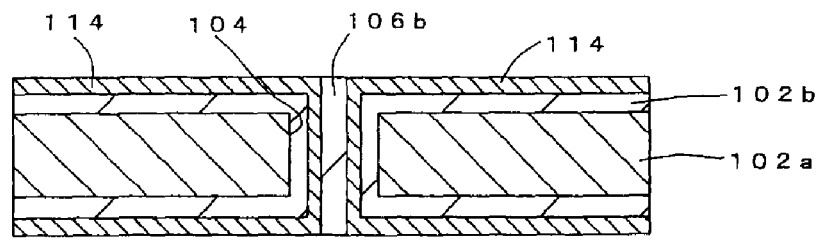
Figure 9A:
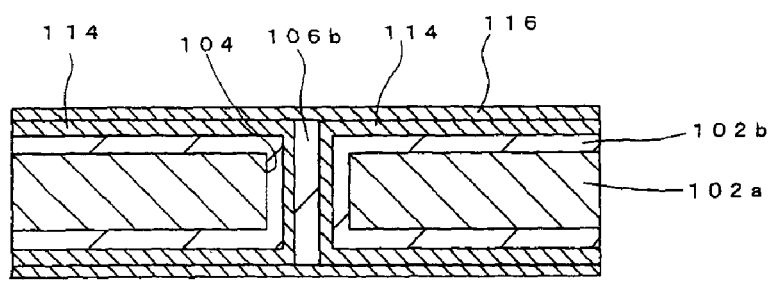
FIGS. 9A and 9B are views illustrating other parts of the steps of manufacturing the related-art wiring substrate shown in FIG. 7.
Figure 9B:
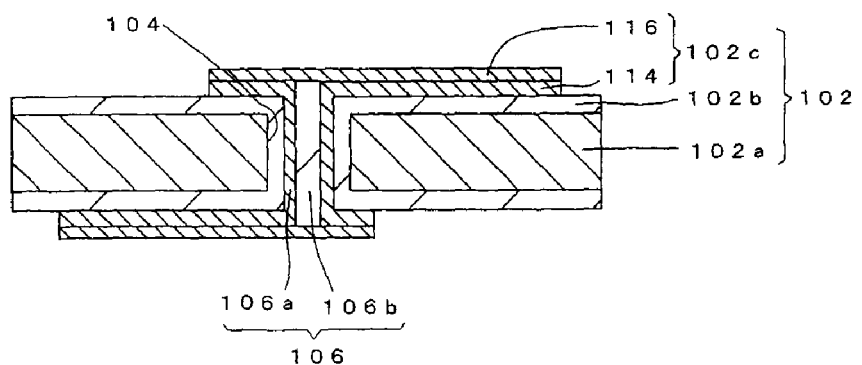

In this way, in the wiring substrate 10 shown in FIG. 1, it is possible to simplify the via structure of the core layer 12 as compared with the via structure of the core layer 102 shown in FIG. 7, and also it is possible to form the via 22 with a small pitch.

Meanwhile, in the wiring substrate 10 shown in FIG. 1, wiring patterns 20, 20 . . . are formed on both side surfaces of the core layer 12 via insulating layers 18.

Steps of manufacturing the wiring substrate shown in FIG. 1 will be described with reference to FIGS. 2A to 3B. Firstly, steps of forming the core layer 12 will be described. As shown in FIGS. 2A and 2B, the through hole 14 is formed so as to pass through the core substrate 12a of the core layer 12, which is made of a carbon fiber and an insulating resin and has a low thermal expansion coefficient, by a drill. Then, a ball 24 where the entire conductive surface of the conductor ball 22a is covered with the insulating member 22b is inserted into the through hole 14. When one surface of the core substrate 12a where the through hole 14 is formed comes in contact with a jig, it is easy to insert the ball 24.

A spherical metal particle having conductivity may be preferably used as the conductor ball 22a of the ball 24. In view of conductivity, a spherical copper particle or aluminum particle may be used as the conductor ball. Particularly, the spherical copper particle may be preferably used as the conductor ball. An insulating resin, or ceramics, such as $SiO_2$ or $Al_2O_3$, may be used as the insulating member 22b that covers the entire conductive surface of the conductor ball 22a. The thickness of the insulating member 22b, which covers the entire conductive surface of the conductor ball 22a, is determined based on the outer diameter of the conductor ball 22a and the inner diameter of the through hole 14. For example, when the outer diameter of the conductor ball 22a is set to 50 μm, the thickness of the insulating member 22b may be in a range of about 20 to 30 μm.

A method described in Japanese Patent No. 3262372 may be employed to form an insulating film on the surface of the spherical metal particle by using a thermoplastic resin. This method includes: heating spherical metal particles up to a temperature, which is equal to or higher than the softening temperature of a thermoplastic resin, while the spherical metal particles are agitated in an apparatus having an agitating mechanism and a heating mechanism; mixing and agitating the metal particles and a thermoplastic resin in order to heat the thermoplastic resin through the heating operation of the metal particles; and fixing the softened and melted thermoplastic resin to the surfaces of the metal particles. Fine powder of ceramics, such as $SiO_2$ or $Al_2O_3$, may be mixed in the thermoplastic resin.

Further, as shown in FIG. 2C, insulating resin layers with metal foil on which metal foil 26 such as copper foil is laminated are thermally press-bonded to both surfaces of the core substrate 12a, and a gap between the inner surface of the through hole 14 and the ball 24 is filled with the insulating resin that forms the insulating layer 12b.

Then, as shown in FIG. 2D, recesses 28, 28 are formed by the irradiation of a laser beam. Each of the recesses has a diameter smaller than that of the through hole 14, and a part of the metal surface, which is the conductive surface of the conductor ball 22a of the ball 24 inserted into the through hole 14, is exposed to the bottoms of the recesses.

As shown in FIG. 3A, the recesses 28, 28 are filled with plated metal by via-filling plating. The via-filling plating includes: forming a thin metal film on the surfaces of the metal foil 26, 26 shown in FIG. 2D and the inner surfaces of the recesses 28, 28 by electroless plating or vapor deposition; and performing electrolytic plating that uses the thin metal film as a power supply layer. Due to the via-filling plating, as shown in FIG. 3A, the recesses 28, 28 are filled with the plated metal, the columnar parts 22c and 22c of which one ends are connected to a part of the conductive surface of the conductor ball 22a are formed, and the plated metal is also precipitated on the metal foil 26, 26 so that a metal layer 30 is formed.

Figure 3B:
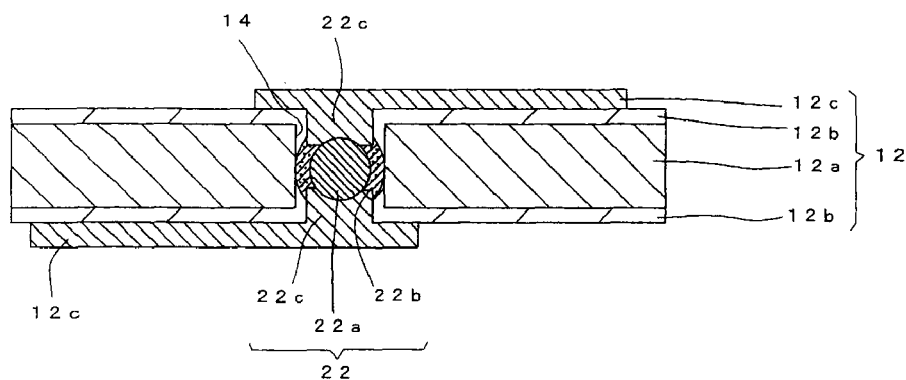

After that, wiring patterns 12c, 12c are formed as shown in FIG. 3B by patterning the metal layer 30, and thus the core layer 12 is formed. The wiring patterns 12c, 12c are electrically connected to each other by the via 22 that passes through the core substrate 12a. In the via 22, one ends of the columnar parts 22c, 22c are connected to the exposure surfaces where the conductive surface of the conductor ball 22a inserted into the through hole 14 are exposed, and the columnar parts 22c, 22c are insulated from the inner peripheral surface of the through hole 14 by the insulating layer 12b and the insulating member 22b that is made of an insulating resin and covers the conductive surface of the conductor ball 22a. Further, the columnar parts 22c, 22c are formed to extend in the longitudinal direction of the through hole 14, and the other ends of the columnar parts 22c, 22c are connected to the wiring patterns 12c, 12c that are formed on the both surfaces of the core substrate 12a.

Furthermore, the wiring patterns 20, 20 . . . are layered on the both surfaces of the core layer 12 shown in FIG. 3B via the insulating layers 18 by a known additive method or semi-additive method. Accordingly, it is possible to form the wiring substrate 10 shown in FIG. 1.

Meanwhile, in the method of manufacturing the wiring substrate shown in FIGS. 2A to 3B, the ball 24 is inserted into the through hole 14 while one surface of the core substrate 12a comes in contact with the jig. Also, after the insulating layer 12b is formed on one surface of the core substrate 12a, the ball 24 may be inserted into the through hole 14.

Figure 4:
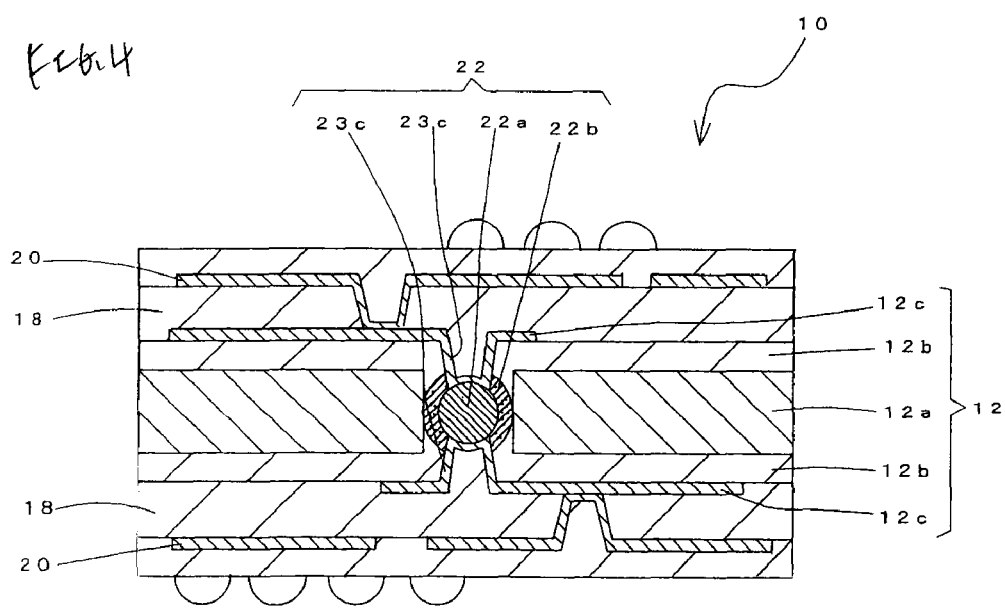
FIG. 4 is a cross-sectional view illustrating the wiring substrate according to another embodiment of the present invention.

As shown in FIG. 4, concave conductor portions 23c and 23c may be employed instead of the columnar parts 22c, 22c forming the via of the wiring substrate 10 shown in FIG. 1.

In a core layer 12 of a wiring substrate 10 shown in FIG. 4, the same components as those of the core layer 12 shown in FIG. 1 are represented by the same reference numerals, and the detailed description thereof will be omitted hereinafter.

Figure 5A:
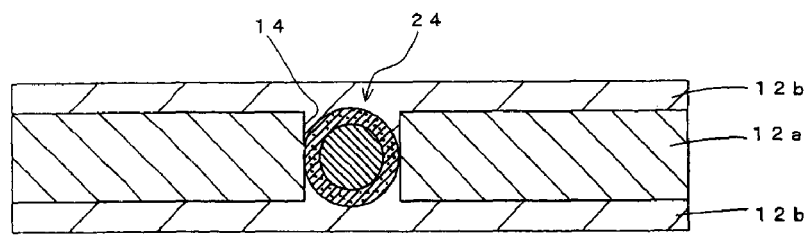
FIGS. 5A to 5D are views illustrating one example of steps of manufacturing the wiring substrate shown in FIG. 4.

In order to form the core layer 12 shown in FIG. 4, firstly, as shown in FIG. 5A, a ball 24 where the entire conductive surface of a conductor ball 22a is covered with an insulating member 22b is inserted into a through hole 14 that is formed so as to pass through a core substrate 12a, which is made of carbon fiber and an insulating resin and has a low thermal expansion coefficient, by a drill. Then, insulating layers 12b, 12b are formed on both surfaces of the core substrate 12a with an insulating resin so that the through hole 14 is filled with the insulating resin (see FIG. 5A).

Figure 5B:
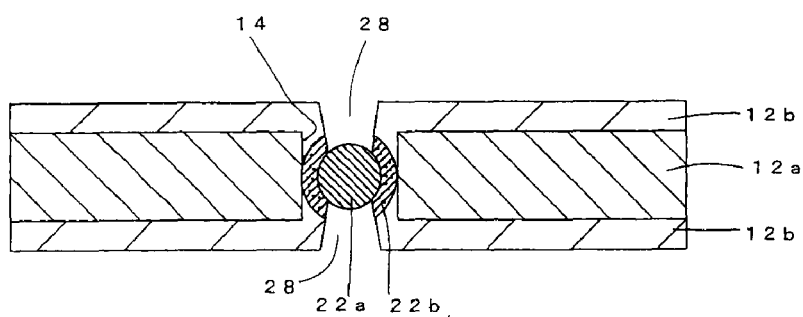

Further, as shown in FIG. 5B, tapered recesses 28, 28 are formed by the irradiation of a laser beam. Each of the recesses has a diameter smaller than that of the through hole 14, and a part of the metal surface, which is the conductive surface of the conductor ball 22a of the ball 24 inserted into the through hole 14, is exposed to the bottoms of the recesses.

Figure 5C:
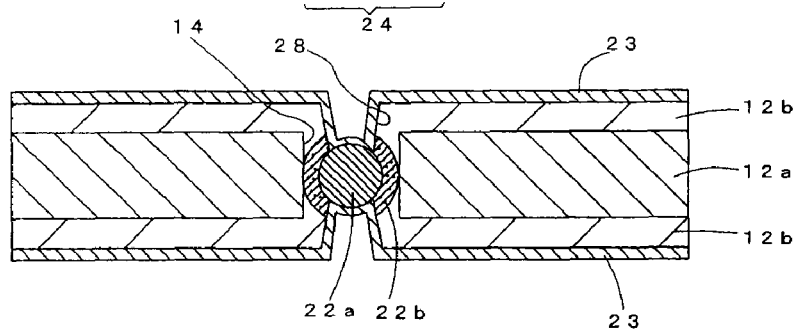

Subsequently, after a thin metal film is formed on the surfaces of the insulating layers 12b, 12b and on the inner surfaces of the recesses 28, 28 by electroless plating or vapor deposition, a metal layer 23 is formed by electrolytic plating that uses the thin metal film as a power supply layer (see FIG. 5C).

Figure 5D:
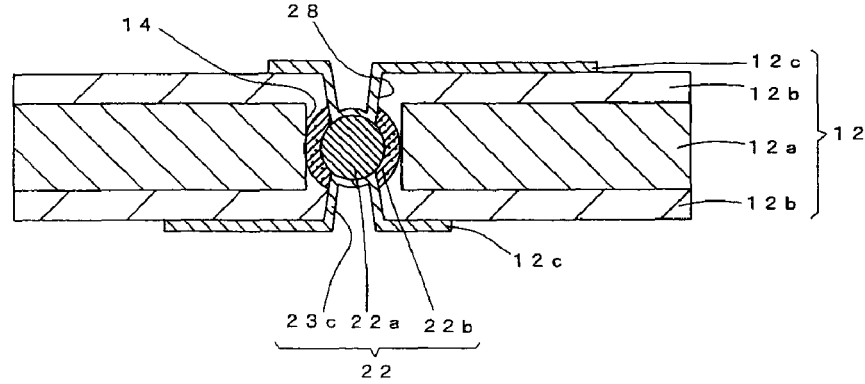

After that, wiring patterns 12c, 12c are formed as shown in FIG. 5D by patterning the metal layer 23, and thus the core layer 12 can be formed. The wiring patterns 12c, 12c are electrically connected to each other by the via 22 that passes through the core substrate 12a. In the via 22, one ends of the concave conductor portions 23c, 23c are connected to the exposure surfaces where the conductive surface of the conductor ball 22a inserted into the through hole 14 are exposed, and the concave conductor portions 23c, 23c are insulated from the inner peripheral surface of the through hole 14 by the insulating layer 12b and an insulating member 22b that is made of an insulating resin and covers the conductive surface of the conductor ball 22a. Further, the concave conductor portions 23c, 23c are formed to extend in the longitudinal direction of the through hole, and the other ends of the concave conductor portions 23c, 23c are connected to the wiring patterns 12c, 12c that are formed on the both surfaces of the core substrate 12a.

Furthermore, the wiring patterns 20, 20 are layered on the both surfaces of the core layer 12 shown in FIG. 5D via insulating layers by a known additive method or semi-additive method. Accordingly, it is possible to form the wiring substrate 10 shown in FIG. 4.

Figure 6A:
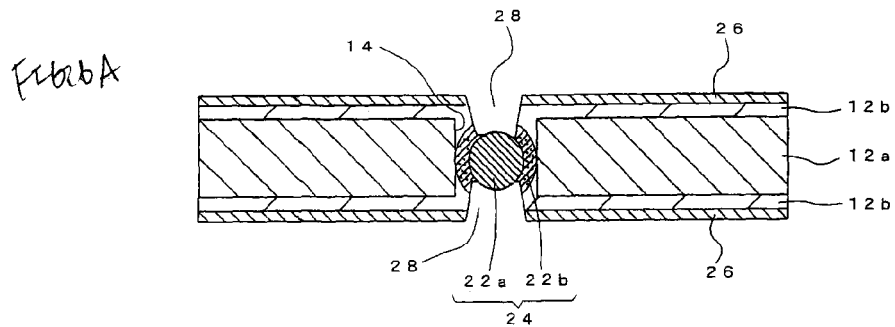
FIGS. 6A to 6C are views illustrating another example of steps of manufacturing the wiring substrate shown in FIG. 4.
Figure 6B:
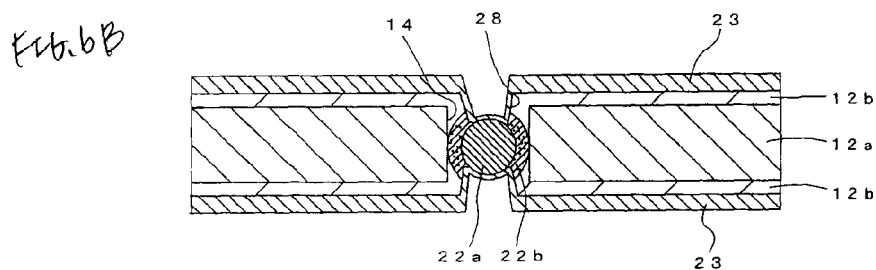
Figure 6C:
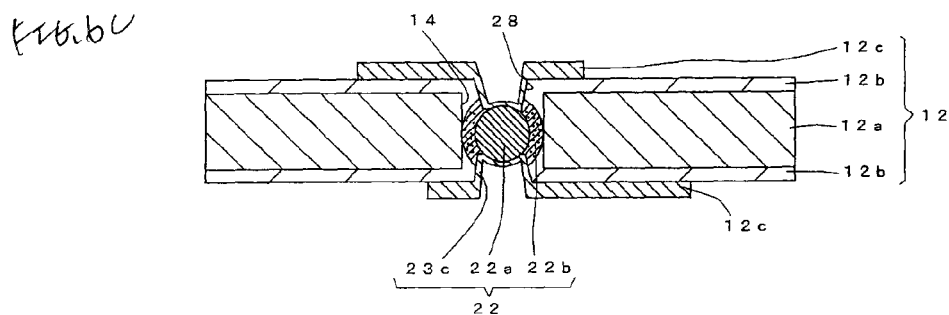

The core layer 12 shown in FIG. 4 can also be formed by a method of manufacturing a wiring substrate shown in FIGS. 6A to 6C. In the method shown in FIGS. 6A to 6C, firstly, as in the steps shown in FIGS. 2A to 2C, the ball 24 where the entire conductive surface of the conductor ball 22a is covered with the insulating member 22b is inserted into the through hole 14 that is formed so as to pass through the core substrate 12a, which is made of a carbon fiber and an insulating resin and has a low thermal expansion coefficient, by a drill. Then, insulating resin layers with metal foil on which metal foil 26 such as copper foil is laminated are thermally press-bonded to both surfaces of the core substrate 12a, and a gap between the inner surface of the through hole 14 and the ball 24 is filled with the insulating resin that forms the insulating layer 12b.

Further, as shown in FIG. 6A, tapered recesses 28, 28 are formed by the irradiation of a laser beam. Each of the recesses has a diameter smaller than that of the through hole 14, and a part of the metal surface, which is the conductive surface of the conductor ball 22a of the ball 24 inserted into the through hole 14, is exposed to the bottoms of the recesses.

Subsequently, after a thin metal film is formed on the surfaces of the insulating layers 12b, 12b and on the inner surfaces of the recesses 28, 28 by electroless plating or vapor deposition, a metal layer 23 is formed by electrolytic plating that uses the thin metal film and the metal foil 26 as a power supply layer (see FIG. 6B).

After that, wiring patterns 12c, 12c are formed as shown in FIG. 6C by patterning the metal layer 23, and thus the core layer 12 can be formed.

Figure 10:
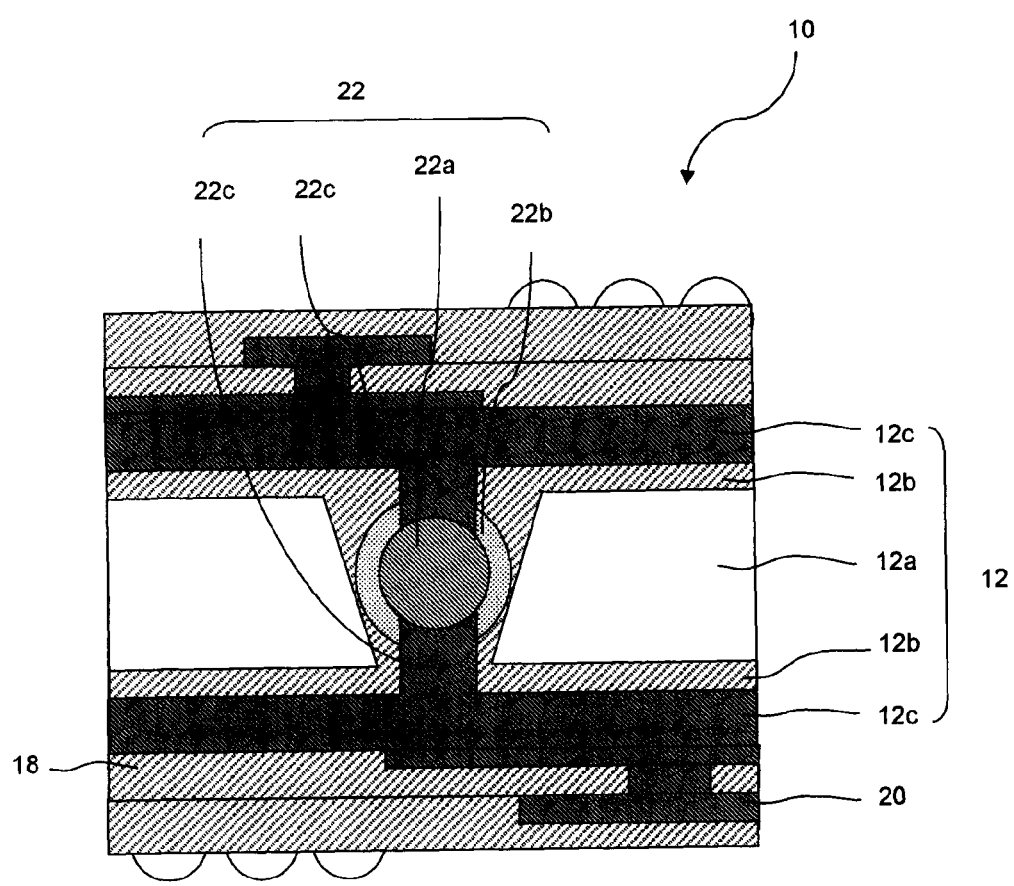
FIG. 10 is a cross-sectional view illustrating a wiring substrate according to another embodiment of the present invention.
Figure 11A:
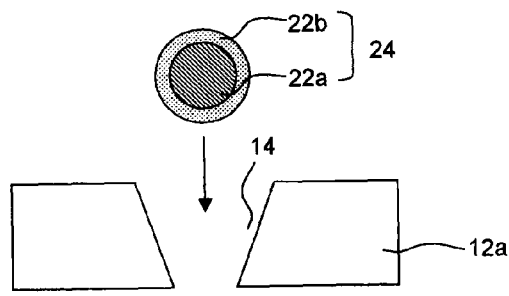
FIGS. 11A to 11F are views illustrating steps of manufacturing the wiring substrate shown in FIG. 10.
Figure 11B:
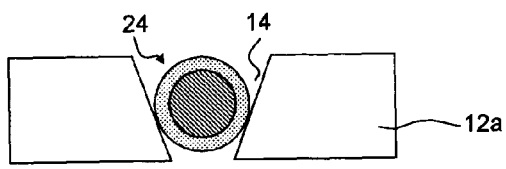
Figure 11C:
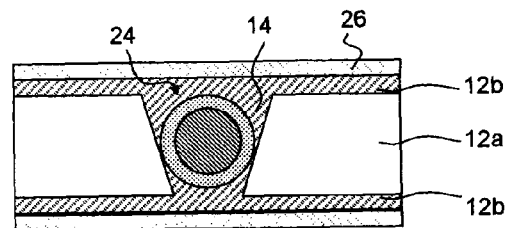
Figure 11D:
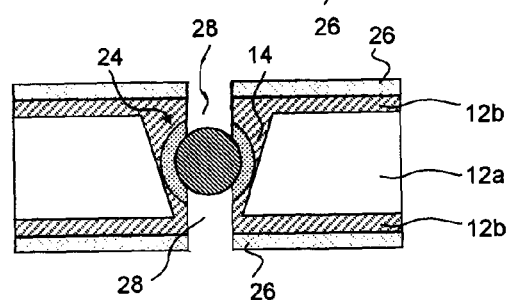
Figure 11E:
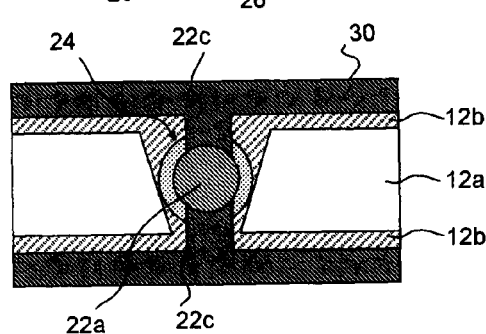
Figure 11F:
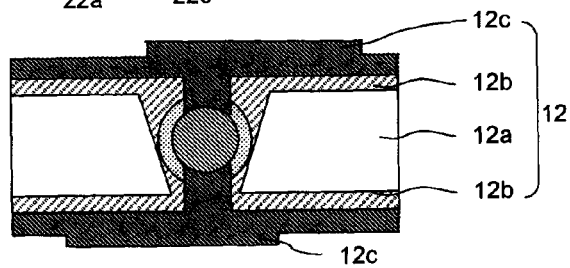

The straight through hole 14 is formed so as to pass through the above-mentioned core substrate 12a. However, as shown in FIG. 10, a tapered through hole, of which one opening on one surface of the core substrate 12a has a diameter larger than the other opening on the other surface of the core substrate, may be formed so as to pass through the core substrate. According to the tapered through hole, it is possible to easily insert the conductor ball 24 into the through hole from the opening having a larger diameter, and also it is possible to position the conductor ball 24, which is inserted into the through hole, at a predetermined position by adjusting an angle of a tapered surface.

In addition, FIGS. 11A to 11F show steps of manufacturing the wiring substrate shown in FIG. 10. The steps shown in FIGS. 11A to 11F are almost the same as those in FIG. 2A to FIG. 3B except for the step of forming the through hole 14 in the core substrate 12a. That is, in FIG. 11A, the through hole 14 is formed into a tapered shape such that one opening on one surface of the core substrate 12a has a diameter larger than the other opening on the other surface of the core substrate 12a.

As described above, according to the steps of manufacturing the wiring substrate 10 shown in FIGS. 2A to 2D, FIGS. 3A and 3B, FIGS. 5A to 5D, and FIGS. 6A to 6C, particularly, the steps of manufacturing the core layer 12 are simplified as compared with the related-art steps of manufacturing the core layer 102 shown in FIGS. 8A to 8F and FIGS. 9A and 9B.

Further, according to the steps of manufacturing the wiring substrate shown in FIGS. 2A to 2D, FIGS. 3A and 3B, FIGS. 5A to 5D, and FIGS. 6A to 6C, unlike in the steps of manufacturing the core layer 102 shown in FIGS. 8A to 8F and FIGS. 9A and 9B, it is possible to omit a step of forming the through hole 105 again in the through hole 104 that is formed so as to pass through the core substrate 102a, and also it is possible to from the via 22 with a small pitch while ensuring the reliability of the via 22.

While a core substrate, which is made of a carbon fiber and an insulating resin and has a low thermal expansion coefficient, is used as the core substrate 12a as shown in FIG. 1 to FIG. 3B, a core substrate made of metal may be used.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A wiring substrate comprising:
   a core substrate formed of a conductive material and having a through hole therein;
   an insulating layer formed on first and second surfaces of the core substrate;
   wiring patterns formed on the first and second surfaces via the insulating layer; and
   a via formed in the through hole and electrically connected to the wiring patterns,
   wherein the via comprises:
   a conductor ball having:
      a conductive surface and;
      an insulating member covering the conductive surface, wherein a portion of the conductive surface is exposed from the insulating member, and
   a conductor portion electrically connected to the exposed conductive surface and the wiring patterns, and
   wherein at least one of the insulating member and the insulating layer is interposed between the via and the core substrate.

2. The wiring substrate according to claim 1, wherein the conductive surface is a metal surface containing a spherical metal particle and the insulating member is an insulating resin film.

3. The wiring substrate according to claim 2, wherein the metal particle is a copper particle.

4. The wiring substrate according to claim 1, wherein the core substrate has the lowest thermal expansion coefficient in the wiring substrate.

5. The wiring substrate according to claim 1, wherein the core substrate is formed of a carbon fiber and an insulating resin.

6. The wiring substrate according to claim 1,
   wherein the through hole is a tapered through hole in which one opening on the first surface of the core substrate has a diameter larger than the other opening on the second surface of the core substrate.

7. A method of manufacturing a wiring substrate, the method comprising:
   (a) forming a through hole in a core substrate formed of a conductive material;
   (b) inserting a conductor ball in the through hole, the conductor ball having a conductive surface and an insulating member covering the entire conductive surface;
   (c) forming an insulating layer on both surfaces of the core substrate and in the through hole;
   (d) forming recesses in the through hole, from the both surfaces of the core substrate, such that a portion of the conductive surface of the conductor ball is exposed from the insulating layer and the insulating member and such that the recesses have a diameter smaller than that of the through hole;
   (e) forming a metal layer in the recesses and on the both surfaces of the core substrate via the insulating layer; and
   (f) patterning the metal layer formed on the both surfaces of the core substrate to form wiring patterns.

8. The method according to claim 7, wherein the conductive surface is a metal surface containing a spherical metal particle and the insulating member is an insulating resin film.

9. The method according to claim 8, wherein the metal particle is a copper particle.

10. The method according to claim 7, wherein the core substrate has the lowest thermal expansion coefficient in the wiring substrate.

11. The method according to claim 7, wherein the core substrate is formed of a carbon fiber and an insulating resin.

12. The method according to claim 7, wherein step (a) comprises:
   forming the through hole into a tapered shape such that one opening on one surface of the core substrate has a diameter larger than the other opening on the other surface of the core substrate.

13. The method according to claim 7, wherein step (c) comprises:
   laminating a metal foil on the insulating layer.

14. The method according to claim 7, wherein in step (c), the insulating layer attached to a metal foil is used.

* * * * *